United States Patent
Perdoor et al.

(10) Patent No.: US 7,579,975 B2
(45) Date of Patent: Aug. 25, 2009

(54) DAC ARCHITECTURE FOR AN ADC PIPELINE

(75) Inventors: Sandeep Mallya Perdoor, Bangalore (IN); Abhaya Kumar, Bangalore (IN); Shakti Shankar Rath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/954,209

(22) Filed: Dec. 11, 2007

(65) Prior Publication Data

US 2009/0146855 A1 Jun. 11, 2009

(51) Int. Cl.
*H03M 1/34* (2006.01)
(52) U.S. Cl. .......................... 341/163; 341/155; 341/161
(58) Field of Classification Search .................. 341/155, 341/161, 163
See application file for complete search history.

(56) References Cited

U.S. PATENT DOCUMENTS

| 6,097,326 | A  | * | 8/2000  | Opris et al. | 341/161 |
| 6,909,391 | B2 | * | 6/2005  | Rossi        | 341/161 |
| 2006/0279448 | A1 | * | 12/2006 | Lu           | 341/161 |
| 2007/0290915 | A1 | * | 12/2007 | Morimoto     | 341/161 |

* cited by examiner

*Primary Examiner*—Jean B Jeanglaude
(74) *Attorney, Agent, or Firm*—John J. Patti; Wade J. Brady, III; Frederick J. Telecky, Jr.

(57) ABSTRACT

A residue block in a stage of a pipeline ADC processing differential signals contains multiple pairs of capacitors. During a hold phase of operation, one capacitor of a pair is connected to a positive reference voltage, and the other capacitor is connected to a negative reference voltage if the input signal exceeds a corresponding threshold voltage. When the input signal does not exceed the corresponding threshold voltage, both capacitors of the pair are connected either to the positive or the negative reference voltage. As a result, the need for a common mode reference voltage may be eliminated, and the residue block can be implemented with a smaller area.

3 Claims, 7 Drawing Sheets

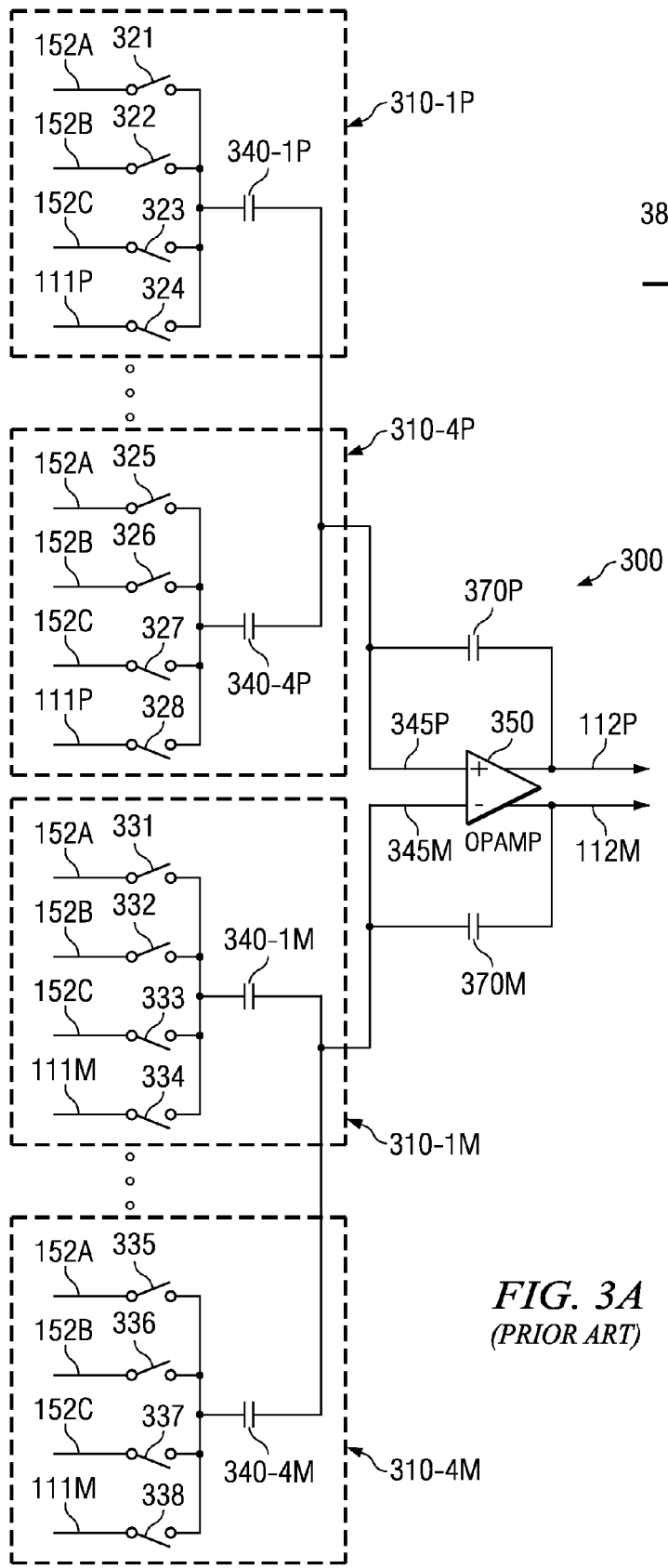
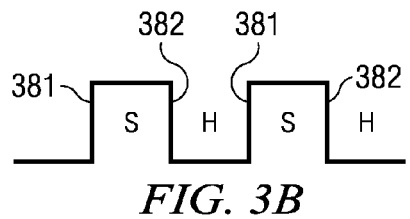
*FIG. 3B*
*FIG. 3A*
*(PRIOR ART)*

DAC ARCHITECTURE FOR AN ADC PIPELINE

BACKGROUND

1. Field of the Technical Disclosure

The present disclosure relates generally to analog to digital converters (ADC), and more specifically to a residue signal generator architecture with reduced number of switches for use in a pipeline ADC that processes differential signals.

2. Related Art

Analog to Digital Converters (ADCs) are used to generate a sequence of digital codes representing the strength of an input signal at corresponding time instances. A pipeline ADC is a type of ADC which contains a sequence of (pipeline) stages, with each stage resolving a number of bits forming a sub code. The sub codes generated by various stages are used to generate a final digital code corresponding to the analog input sampled by the ADC. Assuming the final digital code is N-bits wide, each of the sub-codes may be P bits wide, with P being less than N.

Each stage (except the last stage) of a pipeline ADC generates a residue signal which is the difference of the corresponding input signal and the analog equivalent of the sub-code generated by the stage. Thus, the residual signal may be viewed as representing that portion of the input signal that needs to be resolved by subsequent stages. The residue signal represents a difference of the voltage of the input signal to the stage and the voltage level corresponding to the sub-code provided by the stage. A circuit block in a stage that generates the residue signal is generally referred to as a residue signal generator (residue block).

The architecture of a residue block generally refers to the interconnection of constituent circuit components in the block. A residue block is typically implemented using several switches used to connect different reference voltages to corresponding internal components during operation to generate the residue signal.

A pipeline ADC may process single-ended or differential signals. A differential signal generally refers to a signal whose strength (e.g., voltage) is not referenced (measured with respect to) to a fixed voltage node such as a ground terminal, but instead is measured across a pair of terminals (differential terminals) on which they are provided. In contrast, single-ended signals are provided on a single conductor and the strength is generally measured with respect to a ground terminal.

It is often desirable to reduce the number of components in an integrated circuit, for reasons such as reduced space requirement, power consumption, etc. Accordingly, it may be desirable to reduce the number of switches in a residue block of a pipeline ADC as well.

Several aspects of the present invention provide a residue signal generator architecture with reduced number of switches for use in a pipeline ADC processing differential signals.

BRIEF DESCRIPTION OF THE DRAWINGS

The present invention will be described with reference to the following accompanying drawings, which are described briefly below.

FIG. 3A is a circuit diagram of a residue block of a stage of a pipeline ADC implemented according to a prior technique.

FIG. 3B is a timing diagram illustrating sample and hold phases in a stage of a pipeline ADC.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A residue block in a stage of a pipeline ADC provided according to an aspect of the present invention processes differential signals contains multiple pairs of capacitors. During a hold phase of operation, one capacitor of a pair is connected to a positive reference voltage, and the other capacitor is connected to a negative reference voltage if the input signal exceeds a corresponding threshold voltage. When the input signal does not exceed the corresponding threshold voltage, both capacitors of the pair are connected either to the positive or the negative reference voltage.

As a result, the need for a common mode reference voltage may be eliminated, and the residue block can be implemented with a smaller area.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Component

Figure 1:
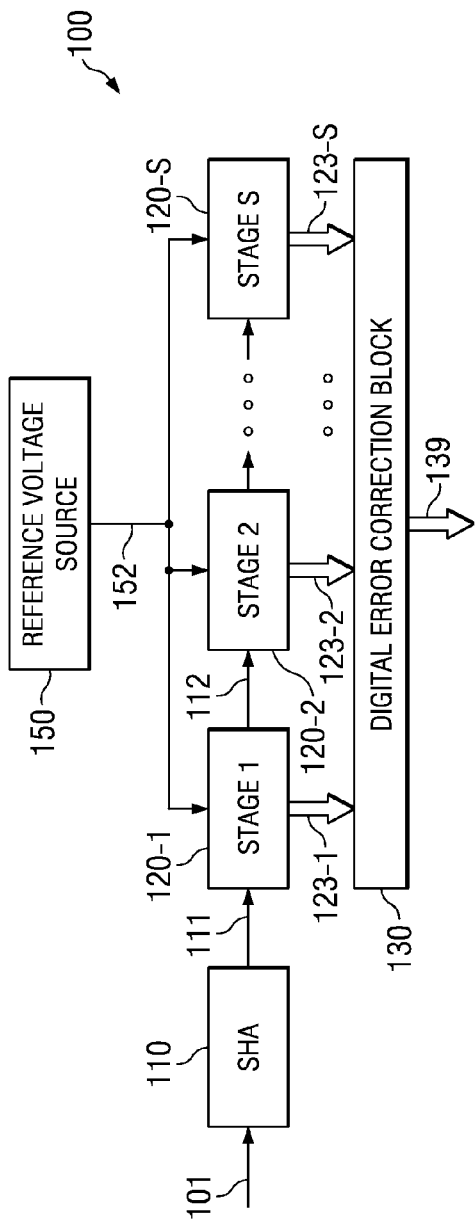
FIG. 1 is a block diagram illustrating the details of an example component in which several aspects of the present invention can be implemented.

FIG. 1 is a block diagram illustrating the details of an example component in which several aspects of the present invention can be implemented. Pipeline ADC 100 processes differential signals, and is shown containing sample and hold amplifier (SHA) 110, stages 120-1 through 120-S, digital error correction block 130, and reference voltage source 150. Path 101 represents a pair of differential input terminals across which a differential input signal is received. Each block is described below in further detail.

SHA 110 samples the input signal received on path 101 and holds the sampled voltage level of the sample on differential signal path 111 for further processing.

Digital error correction block 130 receives sub-codes from various stages (on paths 123-1 through 123-S respectively), and generates a digital code representing the strength of a corresponding sample of the input signal received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Each stage 120-1 through 120-S generates a P-bit sub-code (usually a coarse digital approximation) corresponding to a voltage level of a signal received as a corresponding input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. Each of paths 111, 112 etc represents a differential signal path, and contains a positive path (e.g., 111P) and a negative path (e.g., 111M).

Reference voltage source 150 provides multiple reference voltages on path 152. Corresponding reference voltages may be connected to (corresponding internal circuitry in) stages 120-1 through 120-S. Each of stages 120-1 through 120-S may compare the corresponding input signal with respective voltage references in generating the respective digital codes noted above, as is well known in the relevant arts.

Figure 2:
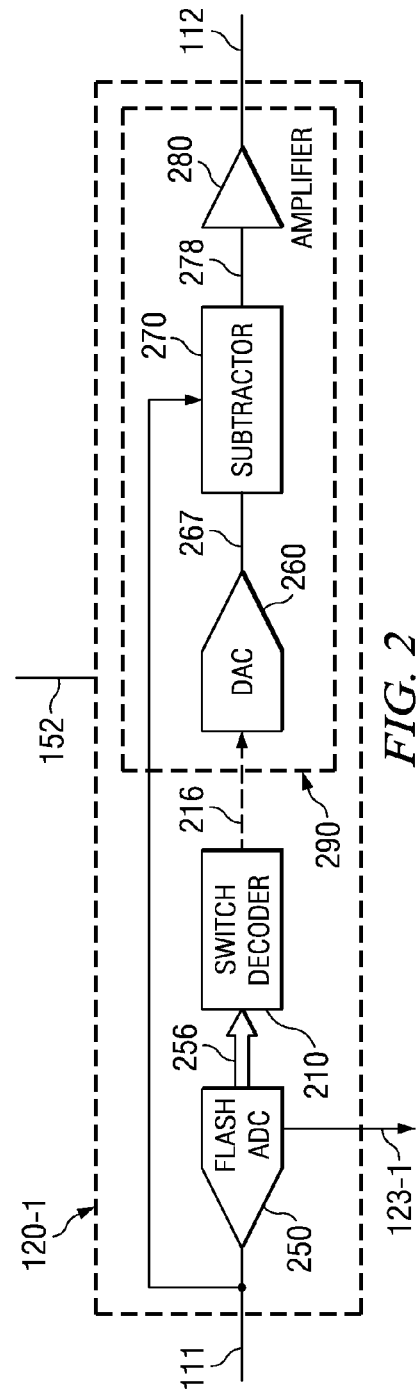
FIG. 2 is a block diagram illustrating the logical operation of a stage of a pipeline ADC.

FIG. 2 further illustrates the logical operation of a stage (described with reference to stage 120-1 only, for conciseness) of pipeline ADC 100 according to a known approach.

With respect to FIG. 2, stage 120-1 is shown containing flash ADC 250 (an example of a sub-ADC), switch decoder 210, digital to analog converter (DAC) 260, subtractor 270 and amplifier 280. DAC 260, subtractor 270 and amplifier 280 may together be referred to as residue block 290.

Flash ADC 250 (an example of a sub ADC) contains two comparator banks, one bank for positive threshold voltages and the other for negative threshold voltages. The number of comparators in each bank is generally equal to $2^{(P-1)}$, wherein P is the number of bits in the sub-code provided by flash ADC 250. For example, assuming flash ADC 250 provides a 3-bit sub-code on path 123-1, flash ADC 250 may contain a total of eight comparators, with four comparators each for positive and negative thresholds. Each comparator generates a pair of complementary output bits (COUTP and COUTM). COUTP is at logic 1 and COUTPM is at logic 0 if the input signal is greater than the corresponding comparator's threshold, while COUTP is a logic 0 and COUTPM is a logic 1 if the input signal is lesser than the comparator's threshold.

The comparator outputs (which will be referred to as flash ADC 250's output bits, and also as control bits to control switches in a residue block in other instances) are provided on path 256 to switch decoder 210. Flash ADC 250 may internally process the output bits (e.g., by encoding) to form the corresponding P-bit sub-code provided on path 123-1, with P less than N, where N is the number of bits in the final digital code provided on path 139 of FIG. 1. The total number of output bits generally equals $2^{(P+1)}$.

Switch decoder 210 decodes the $2^{(P+1)}$ output bits received on path 256, and provides switch control signals on path 216 to open/close corresponding switches in residue block 290, as described below.

DAC 260 converts the $2^{(P+1)}$ output bits received on path 256 (by corresponding operation of switches controlled by switch decoder 210, described below) into corresponding analog signal (Vdac) on path 267. Vdac is generally proportionate to the sub-code and represents the analog equivalent of the resolved sub-code, as is well known in the relevant arts.

Subtractor 270 generates a residue signal as the difference of sample 111 (Vi) and the analog signal received on path 267. Amplifier 280 amplifies the residue signal (Vi-Vdac) which is then provided on path 112 as an amplified residue signal. The signal on path 112 is used to resolve the remaining bits in the N-bit digital code by the subsequent stages of the ADC.

As noted above, DAC 260, subtractor 270 and amplifier 280 may be implemented as a single residue block, and the description is continued with an illustration of the details of residue block 290 according to a prior technique.

3. Prior Residue Block

FIG. 3A is a circuit diagram illustrating the manner in which residue block 300 is implemented according to a prior technique. Residue block 300 is shown with some of the input/output signals of FIGS. 1 and 2 above, merely to illustrate the manner in which the prior technique can be used in the context of those figures. Prior residue block 300 is shown containing operational amplifier (OPAMP) 350, feedback capacitors 370P and 370M, circuit portions 310-1P through 310-4P, and 310-1M through 310-4M.

Circuit portion 310-1P is shown containing sampling capacitor 340-1P, and switches 321, 322, 323 and 324. Circuit portion 310-4P is shown containing sampling capacitor 340-PP and switches 325, 326, 327 and 328. Circuit portion 310-1M is shown containing sampling capacitor 340-1M and switches 331, 332, 333 and 334. Circuit portion 310-4M is shown containing sampling capacitor 340-PM, and switches 335, 336, 337 and 338. Switches 321, 325, 331 and 335 are closed when the corresponding control signal (from switch decoder 210) is a logic 0 (active low). All other switches are closed when the corresponding control signal is a logic 1 (active high).

For ease of description, it is assumed that stage 120-1 provides a 3-bit sub-code. Therefore, residue block 300 has eight circuit portions circuit portions 310-1P through 310-4P, and 310-1M through 310-4M, with four each two each connected to the non-inverting (345P) and inverting (345M) terminals of OPAMP 350. In general, the number of circuit portions equals $2^P$. The operation of all switches is assumed to be controlled by output 216 of switch decoder 210.

Capacitors 340-1P through 340-4P may be viewed as forming one capacitor bank (containing the positive side capacitors for the differential implementation), while capacitors 340-1M through 340-4M form another capacitor bank (containing the negative side capacitors for the differential implementation.

Path 152A contains a positive reference voltage REFP, path 152B contains a negative reference voltage REFM, and path 152C contains a common-mode reference voltage REFCM. Paths 152A, 152B and 152C are assumed to be contained in path 152 (FIG. 2). Paths 111P and 111M represent the 'positive' and 'negative' signal paths of differential path 111.

Typically, residue block 300 samples input signal 111 during a sample phase, and generates the residue signal during an immediately following hold phase. A next sample of input signal 111 is received during a next sample phase, and the corresponding residue signal is generated, and the procedure is repeated. FIG. 3B illustrates an example timing diagram of a clock signal specifying the time instances of start and end of sample (S) and hold (H) phases, in which time instances 381 denote start of a sample phase, and time instances 382 denoted start of a hold phase.

In operation, during a first (e.g., sample) phase, switches 324, 328, 334 and 338 (as well as other corresponding sampling switches, not shown) are closed (by signals, not shown, but generated from within the stage or from outside, in a known way), while all other switches are open. As a result, capacitors 340-1P through 340-4P and 340-1M through 340-4M are charged to the voltage of input sample received on path 111.

During a next (e.g., hold) phase, switches 324, 328, 334 and 338 (as well as other corresponding switches, not shown) are opened (by signals, not shown, but generated from within the stage or from outside, in a known way). Decoder 210 connects (by closing the corresponding switches) capacitors in the two capacitor banks to one of REFP, REFM or REFCM (via corresponding switches) based on the logic levels of the output bits received on path 256 (FIG. 2).

In general, a capacitor on the positive side is connected to REFP (with the corresponding capacitor on the negative side being connected to REFM), if the output bits indicate that input signal 111 is greater (more positive) than the corresponding positive threshold. On the other hand, if the output bits indicate that input signal 111 is smaller (more negative) than the corresponding negative threshold, the capacitor on the positive side is connected to REFM, with the corresponding capacitor on the negative side being connected to REFP.

However, if input signal 111 has a strength which is between the corresponding positive and negative thresholds, both capacitors are connected to REFCM. Decoder 290 decodes the output bits on path 256 to connect each of the capacitors to the corresponding reference voltages in the manner noted above.

As a result, the capacitor banks transfer a charge proportional to the difference (residue) of input signal 111 and a signal representing the P-bit sub-code to feedback capacitor 370P/370M. The residue is amplified by OPAMP 350, and is provided as amplified residue signal 112 (112P/112M) to the next stage, as desired.

The prior technique described above has some drawbacks. A large number of switches (four in the above example) are required per circuit portion, rendering the switch decoding logic in switch decoder 210 more complex, and requiring larger implementation area.

Further, switches used to pass REFCM generally have to be larger in size to ensure that REFCM is passed reliably (without any voltage drop or distortion). As a result, the area required to implement the circuit may be relatively large.

Another general requirement is that voltages REFP, REFM, REFCM should not be become shorted with one another during operation. In the circuit of FIG. 3A, this may happen when input 111 has a value very close to a comparator threshold (within flash ADC 250), i.e. close to the threshold point where an output bit of the P-bit sub-code changes between logic levels. In such a scenario, the output bit value may be metastable for some duration. Shorting can also happen, if during power-ON, REFP is lower than REFM. Therefore, the switch decoding logic in switch decoder 210 may be required to handle such scenarios. A prior implementation of the switch decoding logic for the circuit of FIG. 3A is shown in FIG. 4.

4. Prior Switch Decoding Logic

Figure 4:
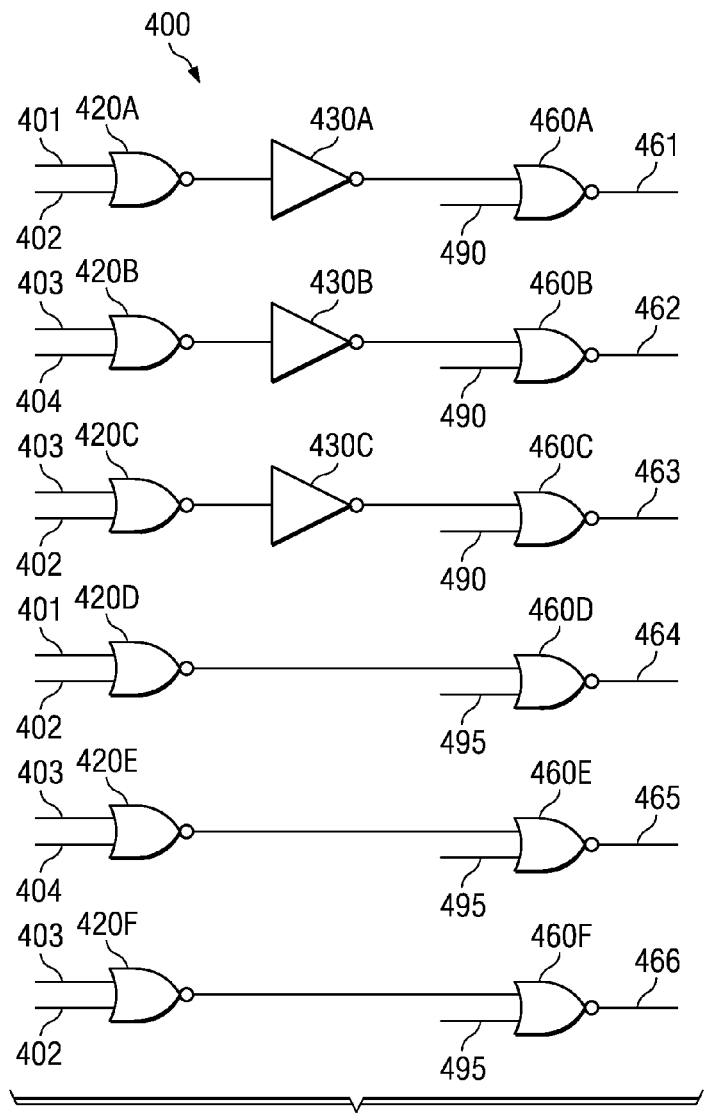
FIG. 4 is a logic diagram of a prior switch decoding block to control switches of a prior residue block.

FIG. 4 is a logic diagram of switch decoder 400 used in the prior embodiment of FIG. 3A. Switch decoder 400 can be used in the place of decoder 210 when residue block 300 is used in the place of residue block 290 of FIG. 2. Prior switch decoder 400 is shown containing NOR gates 420A-420F, 460A-460C, NAND gates 460D-460F, and NOT gates 430A-430C. Paths 401, 402, 403 and 404 are assumed to be contained in path 256 (FIG. 2), and paths 461-466 are assumed to be contained in path 216 (FIG. 2).

Assuming, as above, that the P-bit sub-code generated by flash ADC 250 is 3 bits wide, path 401 contains higher order COUTM bits (bits 4 through 7), path 402 contains the lower order (0 through 3) COUTM bits, path 403 contains the higher order (4 through 7) COUTP bits, and path 404 contains the lower order (0 through 3) COUTP bits.

Path 490 and path 495 receive complementary gating signals (HOLD and HOLDZ) to ensure that all outputs (461-466) become active at the same time instance, irrespective of the number of gate delays involved in their generation.

Path 461 contains switch control signals for controlling the switches (such as 332, 336) in circuit portions 310-1M through 310-4M that connect the corresponding capacitor to REFM. Path 464 contains switch control signals for controlling the switches (such as 321, 325) in circuit portions 310-1P through 310-4P that connect the corresponding capacitor to REFP.

Path 462 contains switch control signals for controlling the switches (such as 322, 326) in circuit portions 310-1P through 310-4P that connect the corresponding capacitor to REFM. Path 465 contains switch control signals for controlling the switches (such as 331, 335) in circuit portions 310-1M through 310-4M that connect the corresponding capacitor to REFP.

Path 463 contains switch control signals for controlling the switches (such as 323, 327) in circuit portions 310-1P through 310-4P that connect the corresponding capacitor to REFCM. Path 466 contains switch control signals for controlling the switches (such as 333, 337) in circuit portions 310-1M through 310-4M that connect the corresponding capacitor to REFCM.

From the decoding logic of FIG. 4, it may be observed that more than one level of logic (three in the example) is needed. In general, it may be appreciated that the prior technique requires complex decoding logic, and larger area for implementation as noted above.

Figure 5:
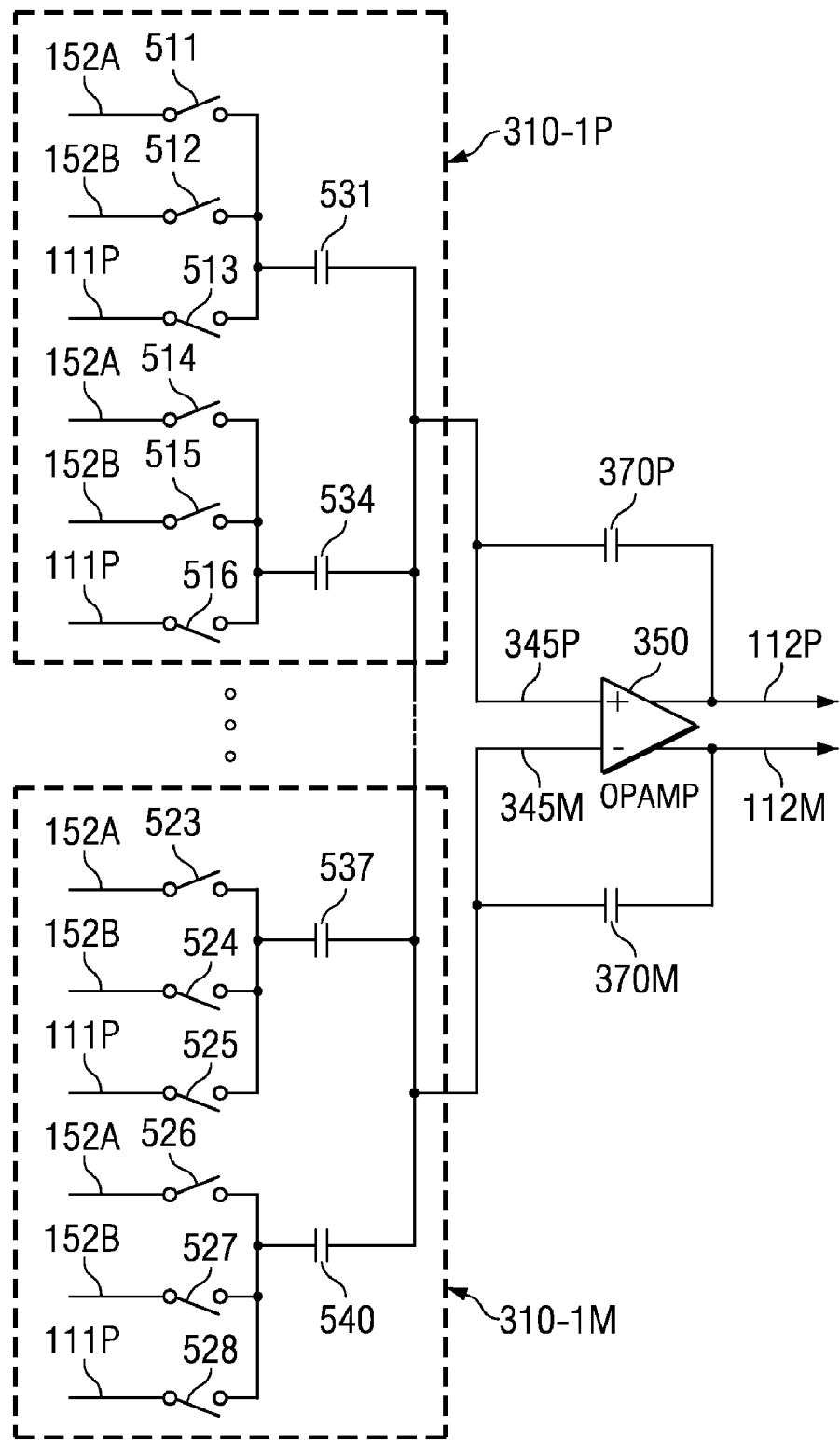
FIG. 5 is a circuit diagram of a residue block of a stage of a pipeline ADC implemented according to another prior technique.

Another prior technique that addresses the problem of large switches being required for passing REFCM is illustrated in FIG. 5. In the circuit of FIG. 5, each capacitor is replaced by two capacitors with half the capacitance value. Only the portions corresponding to capacitors 531 and 534 (used in place of capacitor 340-1P of FIG. 3A), and capacitors 537 and 540 (used in place of capacitor 340-1M) are shown.

It may be observed from the Figure that REFCM is not used, and each capacitor need be connected (during the corresponding phase) only to either REFP or REFM (in addition to input 111 during the alternate phase).

To describe the switch connections of FIG. 5 with respect to those of FIG. 3A, when a capacitor such as 340-1P is to be connected to REFP, the corresponding capacitors 531 and 534 are both connected to REFP. When capacitor 340-1P is to be connected to REFM, the corresponding capacitors 531 and 534 are both connected to REFM. However, when capacitor 340-1P is to be connected to REFCM, one capacitor (e.g., 531) is connected to REFP, while the other (534) is connected to REFM.

The technique of FIG. 5 eliminates the need for large switches to pass REFCM, and requires only one level of decoding logic for the switches.

However, the technique requires twice as many capacitors as compared to the technique of FIG. 3A. As a result, routing of signal paths connecting the capacitor terminals is more complicated and inefficient at least due to the larger number of capacitor terminals. Further, the capacitors being smaller in value, it may be difficult in practice to implement the capacitors to have the same (or at least closely matched) capacitance value.

Several aspects of the present invention overcome at least some of the deficiencies noted above as described next.

5. Residue Block Architecture Requiring Fewer Switches

Figure 6:
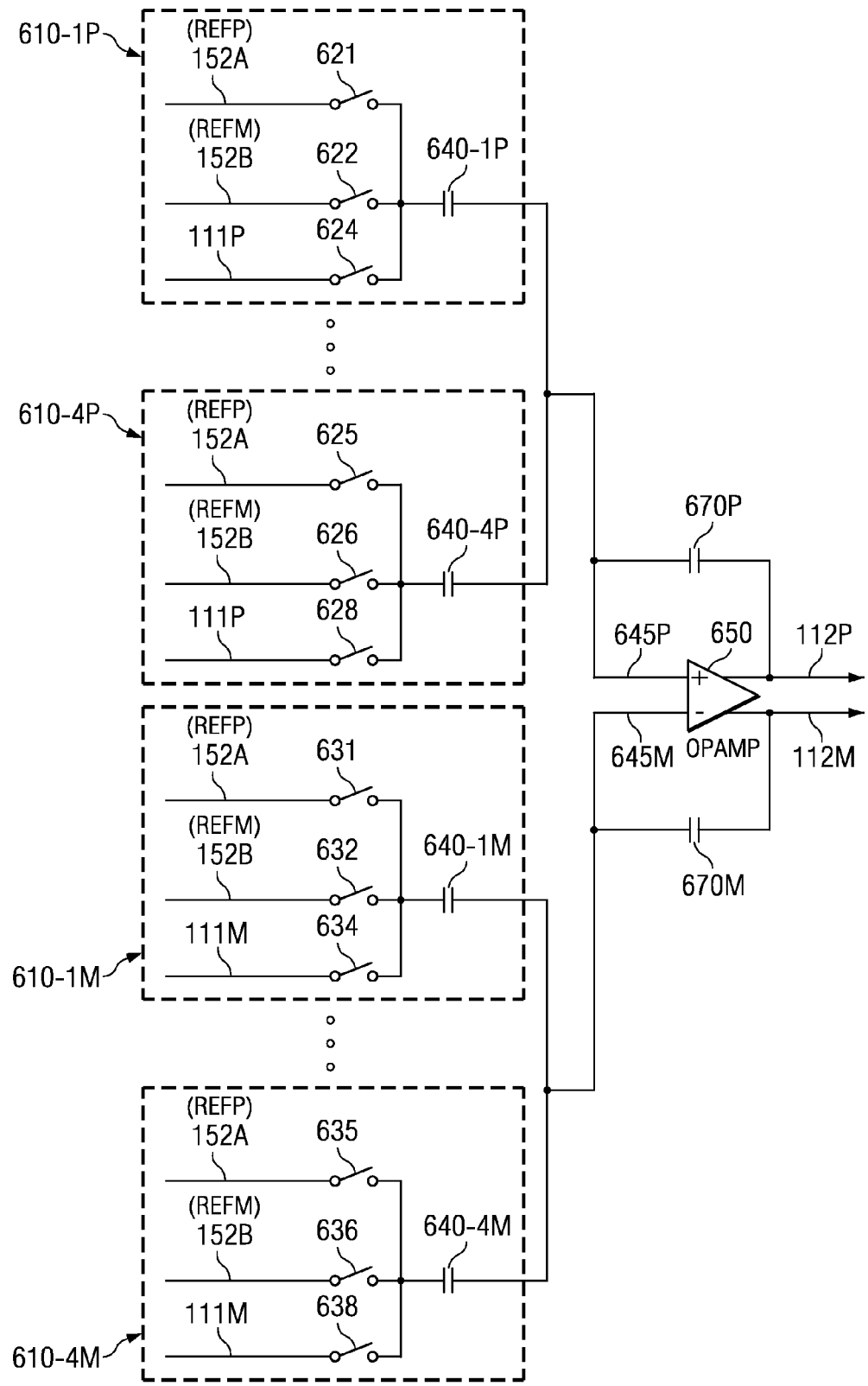
FIG. 6 is a circuit diagram illustrating the manner in which a residue block in a stage of a pipeline ADC is implemented in an embodiment of the present invention.

FIG. 6 is a circuit diagram illustrating the manner in which a residue block contained in a stage of a pipeline ADC is implemented in an embodiment of the present invention. Residue block 600 is shown containing operational amplifier (OPAMP) 650, feedback capacitors 670P and 670M, circuit portions 610-1P through 610-PP, and 610-1M through 610-PM.

Merely for ease of description, it is assumed in the following description that residue block 600 is used in place of residue block 290 of FIG. 2. However, a residue block implemented according to the following description may be used in other stages of a pipeline ADC as well, as will be apparent to one skilled in the relevant arts. The operation of all switches (except sampling switches 624, 628, 634 and 638) in residue block 600 is assumed to be controlled by outputs (not shown in FIG. 6) on path 256 of a switch decoder, described below. Sampling switches (624, 628, 634 and 638) are assumed to be controlled by signals generated within the stage or externally, in a known way.

Also, outputs of OPAMP 650 are shown as being differential merely for illustration, alternative embodiments can be implemented with the output of OPAMP 650 being single-ended. In such a case, one of the feedback capacitors, for example 370M, is connected between an input (e.g., 345M) and a ground terminal, and the corresponding output terminal (112M in the example) is not used.

Circuit portion 610-1P is shown containing sampling capacitor 640-1P, and switches 621, 622, and 624. Circuit portion 610-4P is shown containing sampling capacitor 640-4P and switches 625, 626, and 628. Circuit portion 610-1M is shown containing sampling capacitor 640-1M and switches 631, 632, and 634. Circuit portion 610-4M is shown containing sampling capacitor 640-4M, and switches 635, 636, and 638.

Switches 621, 625, 631 and 635 are closed when the corresponding control signal is a logic 0 (active low). All other switches are closed when the corresponding control signal is a logic 1 (active high). For conciseness, only four circuit portions are shown, two each connected to the non-inverting (645P) and inverting (645M) terminals of OPAMP 650. Typically, each of capacitors 640-1P through 640-4P, and 640-1M through 640-4M have the same capacitance value.

Merely for ease of description, it is assumed that stage 120-1 provides a 3-bit sub-code. Therefore, residue block 600 has eight circuit portions 610-1P through 610-4P, and 610-1M through 610-4M, with four each connected to the non-inverting (645P) and inverting (645M) terminals of OPAMP 650. In general, the number of circuit portions equals $2^P$ for a P bit sub-code.

Capacitors 640-1P through 640-4P may be viewed as forming one capacitor bank (containing the positive side capacitors for the differential implementation), while capacitors 640-1M through 640-4M form another capacitor bank (containing the negative side capacitors for the differential implementation).

Path 152A receives a positive reference voltage REFP, and path 152B receives a negative reference voltage REFM. Paths 152A and 152B are assumed to be contained in path 152 (FIG. 2). Paths 111P and 111M represent the 'positive' and 'negative' signal paths of differential path 111.

In operation, during a first (e.g., sampling) phase, switches 624, 628, 634 and 638 (as well as other corresponding switches, not shown) are closed, while all other switches are open. As a result, capacitors 640-1P through 640-4P and 640-1M through 640-4M are charged to the voltage of input sample received on path 111.

During a next (e.g., hold) phase, switches 624, 628, 634 and 638 (as well as other corresponding switches, not shown) are open. Respective capacitors (of capacitor pairs, as noted above) in the two capacitor banks are connected to one of REFP or REFM (via corresponding switches) based on the logic levels of the corresponding output bits on path 256 (FIG. 2). Example sample and hold phases of operation are similar to those noted above with respect to FIG. 3B.

For each capacitor pair, if input signal 111 is greater (more positive) than the corresponding positive threshold, the capacitor in the pair connected to the positive terminal of OPAMP 650 is connected to REFP, while the other capacitor in the pair is connected to REFM. On the other hand, if input signal 111 is smaller (more negative) than the corresponding negative threshold, the capacitor in the pair connected to the positive terminal of OPAMP 650 is connected to REFM, while the other capacitor in the pair is connected to REFP (by operation of the appropriate switches).

However, if input signal 111 has a strength that lies between the two corresponding thresholds, both the capacitors of the pair are connected to either REFP or REFM. The manner in which the connection to the capacitors is made is illustrated below with respect to FIGS. 7 and 8 with examples. It must be understood that FIGS. 7 and 8 are provided merely to illustrate with examples, and different structures and comparator thresholds may also be used.

Figure 7:
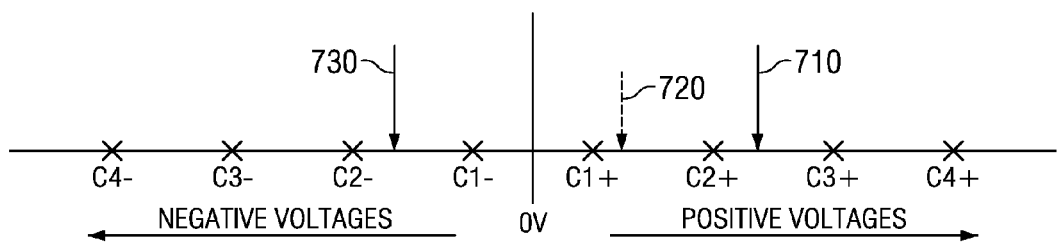
FIG. 7 is a diagram illustrating comparator thresholds used in a sub-ADC of a stage in an embodiment of the present invention.
Figure 8:
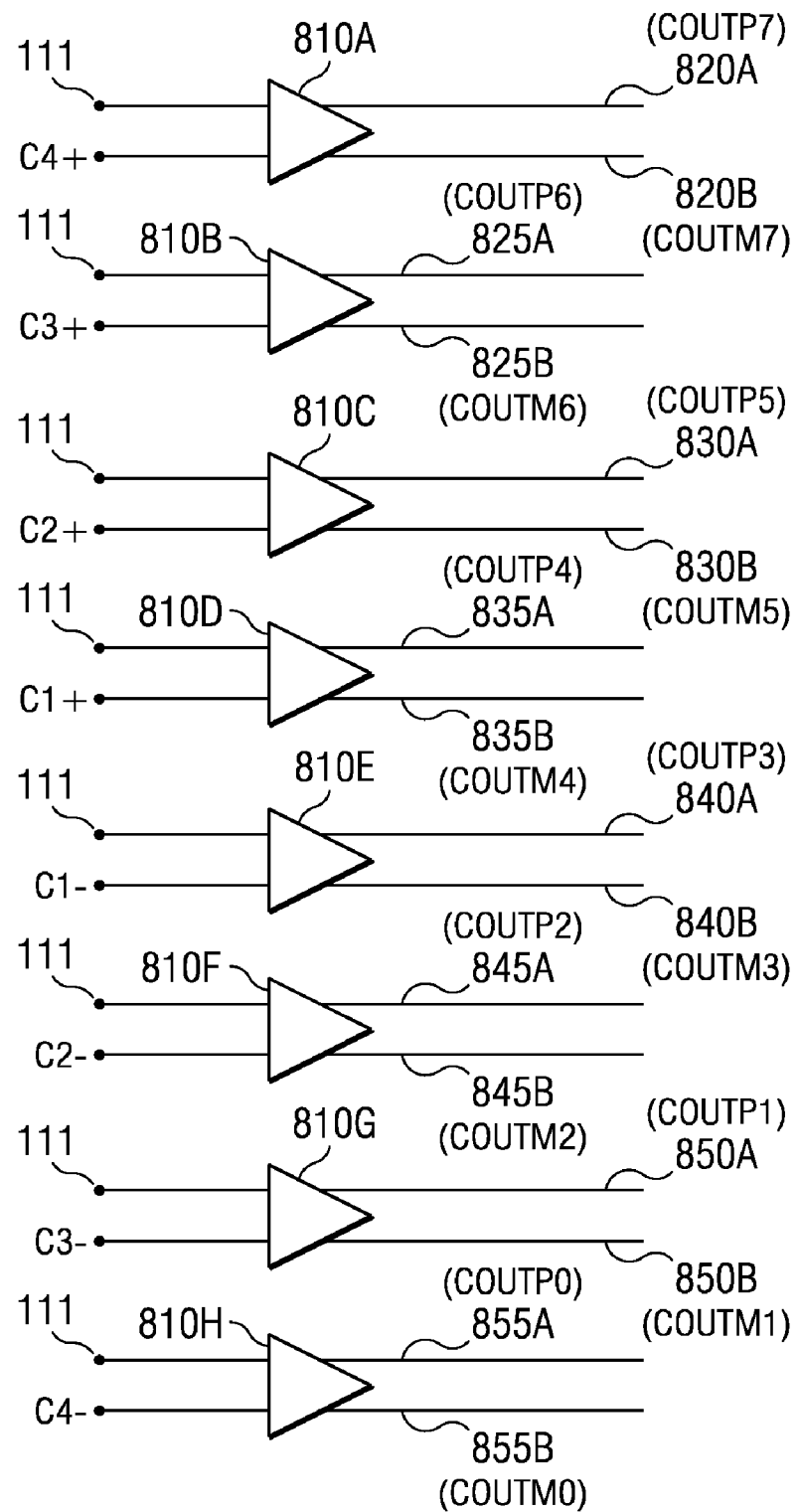
FIG. 8 is a diagram illustrating comparator outputs of a sub-ADC of a stage in an embodiment of the present invention.

In FIG. 7, eight comparator thresholds (used in Flash ADC 250 providing a 3-bit sub-code as in the example above) are shown marked as C4− through C4+. Voltage levels C1+ through C4+ denote the four positive thresholds, while C1− through C4− denote the corresponding four negative thresholds. In general, C1-C4 represent a sequence of magnitudes, representing the voltage levels generated by a voltage divider network inside a sub-ADC. Typically, the magnitudes (disregarding the sign) of C1+ and C1− are the same. Similarly, C2+ and C2− have a same magnitude, C3+ and C3− have a same magnitude, and C4+ and C4− have a same magnitude.

It should be appreciated that the input signal can have a voltage, which has one of three possible relationships with respect to a threshold pair [each of (C1+, C1−), (C2+, C2−), (C3+, C3−) (C4+, C4−)]. For example, with respect to (C1+, C1−), marker 710 has a value which is more positive than the corresponding positive threshold C1+. Marker 720 has a value which is between the voltages represented by threshold pair (C2+, C2−). Marker 730 has a value which is more negative than the negative threshold of threshold pair (C1+, C1−).

Each pair of corresponding values [(C1+, C1−) . . . (C4+, C4−)] may be viewed as being associated with a pair of capacitors selected from the first and second capacitor banks noted above. For example, capacitor 640-1P may be viewed as being associated with positive threshold C1+ and capacitor 640-1M as being associated with negative threshold C1−. Association of other pairs is similarly described.

FIG. 8 shows comparators 810A-810H (assumed to be contained in Flash ADC 250 of FIG. 2) providing $2^{(P+1)}$ output bits (assumed to be contained in path 256 of FIG. 2, wherein P is the width of the sub-code provide by ADC 250) as a binary result of a comparison of input signal 111 with a corresponding threshold voltage (generated internally in stage 120-1, for example, using a resistor ladder network operating as a voltage divider, not shown). Although the comparators are shown as generating a total of $2^{(P+1)}$ output bits (being pseudo-differential outputs), only $2^{(P)}$ output bits may be generated in other embodiments.

Each comparator receives input 111 (in differential form) and a corresponding threshold reference voltage (also in differential form), and provides corresponding output bits as a comparison result of the two.

With combined reference to FIGS. 7 and 8, comparators 801A-810H respectively compare input signal 111 with thresholds C4−, C3−, C2−, C1−, C1+, C2+, C3+ and C4+. Capacitors 640-1P and 640-1M are associated with the outputs of comparators 810D and 810E (i.e., threshold pair C1+ and C1−). Capacitors 640-4P and 640-4M are associated with the outputs of comparators 810A and 810H (i.e., threshold pair C4+ and C4−). Other capacitor pairs in FIG. 6 are similarly associated with the other corresponding threshold and comparator pairs.

When input signal 111 exceeds a comparators threshold (i.e., if input signal 111 is more positive than a positive threshold, or more negative than a negative threshold), the COUTP output bit is at logic 1 and the COUTM output bit is at logic 0. Otherwise, the COUTP output bit is at logic 0 and the COUTM output bit is at logic 1.

As an example, assuming that the differential input signal 111 has a strength (voltage) as denoted by marker 710, the COUTP and COUTM bits (marked in FIG. 8 as COUTP1 (850A), COUTM1(850B), etc.,) of comparators 810C-810H will be logic 1 and logic 0 respectively, while the COUTP and COUTM bits of comparators 810A and 810B will be logic 0 and logic 1 respectively.

Since input signal 111 is more positive than C1+, capacitor 640-1P is connected (in the second/hold phase) to REFP, and capacitor 640-1M is connected to REFM. Similarly, since input signal 111 is more positive than C2+, capacitor 640-2P (not shown) is connected to REFP, and capacitor 640-2M (not shown) is connected to REFM.

However, since input signal 111 has a value that lies between thresholds C3− and C3+, capacitors 640-3P and 640-3M (both not shown) are both connected to either REFP or REFM. Similarly, since input signal 111 has a value that lies between thresholds C4− and C4+, capacitors 640-4P and 640-4M are both connected either to REFP or REFM. This ensures that the differential voltage contribution by these capacitor pairs (640-3P/640-3M and 640-4P and 640-4M) is zero volts.

In an embodiment, the two capacitor pairs are alternately connected to REFP/REFM, for example, pair 640-3P/640-3M may be connected to REFP, while pair 640-4P/640-4M is connected to REFM. The common mode voltage at the bottom plate of the capacitors (plate connected to switches) in this example will be the average of REFP and REFM, as the number of capacitor pairs connected to REFP equals the number of capacitor pairs connected to REFM.

In a manner similar to that noted above with respect to FIG. 3A, the capacitor banks transfer a charge proportional to the difference (residue) of input signal 111 and a signal representing the P-bit sub-code to feedback capacitor 670P/670M. The residue is amplified by OPAMP 650, and is provided as amplified residue signal 112 (112P/112M) to the next stage, as desired.

It may be observed that in contrast to the technique of FIG. 3A, there is no requirement to use a common mode reference voltage REFCM. As a result, the number of switches is reduced. Specifically, since there is no need to provide REFCM, the large switches used to pass REFCM are now eliminated. Residue block 600, may thus be implemented using a smaller area.

It may also be observed that residue block 600 uses only half as many capacitors as the technique of FIG. 5. Since the capacitors of FIG. 6 have a higher capacitance value in comparison to those of FIG. 5, the mismatch in the values is also lesser. Further, in comparison to the technique of FIG. 5, due to the lesser number of capacitors, routing of signal paths connecting the capacitor terminals is less complicated and more efficient.

It is noted that when the number of capacitor pairs (with both capacitors in the pair) connected to REFP does not equal the number of capacitor pairs connected to REFM (a scenario which occurs when input signal has a strength denoted by marker 720 in FIG. 7), the common mode of residue block 600 deviates from the average of REFP and REFM by a value $(REFP-REFM)/2^{(P)}$, wherein 'P' is the width of the sub-code generated by stage 120-1. However, such an offset is generally negligible in practical implementations.

A switch decoder providing signals to operate the switches of the embodiment described above is next described.

6. Decoding Logic

Figure 9:
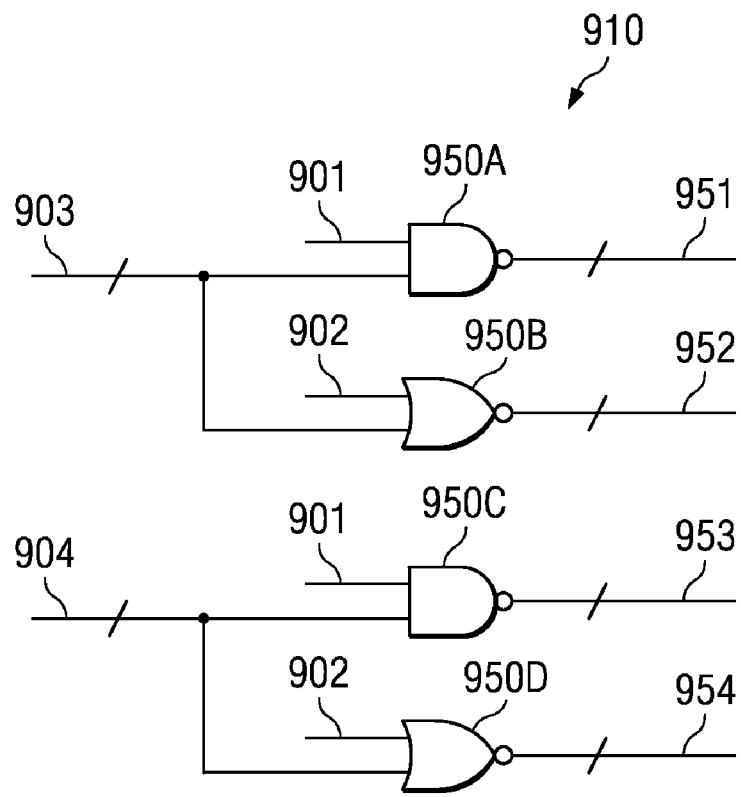
FIG. 9 is a logic diagram of a switch decoder controlling switches of a residue block in an embodiment of the present invention.

FIG. 9 is a block diagram of a switch decoder that provides signals to operate switches in residue block 600 of FIG. 6. Switch decoder 910 is shown containing NAND gates 950A and 950C, and NOR gates 950B and 950D. In the description below, it is assumed that switch decoder 910 is used in place of switch decoder 210 of FIG. 2.

Bus 903 contains output bits COUTP0 (855A), COUTP2 (845A), COUTP4 (835A) and COUTP6 (825A) of FIG. 8. Each output bit on the bus is NANDed with a gating signal received on path 901 to generate a corresponding control bit on bus 951, and NORed with a gating signal received on path 902 to generate a corresponding control bit on bus 952. Similarly, bus 904 contains output bits COUTM1 (850B), COUTM3 (840B), COUTM5 (830B) and COUTM7 (820B) of FIG. 8. Each output bit on bus 904 is NANDed with a gating signal received on path 901 to generate a corresponding control bit on bus 953, and NORed with a gating signal received on path 902 to generate a corresponding control bit on bus 954. Paths 903 and 904 are assumed to be contained in path 256 (FIG. 2).

Paths 901 and 902 receive complementary gating signals HOLD (active high) and HOLDZ (active low) respectively to ensure that all outputs (951-954) become active at the same time instance. These signals can be generated from within the stage or from outside, in a known way.

Bus 951 contains switch control signals SUBZ0, SUBZ1, SUBZ2 and SUBZ3 (all active low) respectively controlling switches (such as 621,625, and two others not shown in FIG. 6) in respective circuit portions 610-1P through 610-4P to REFP. Bus 952 contains switch control signals ADD0, ADD1, ADD2 and ADD3 (all active high) respectively controlling switches (such as 622, 626) in circuit portions 610-1P through 610-4P to REFM.

Bus 953 contains switch control signals ADDZ0, ADDZ1, ADDZ2 and ADDZ3 (all active low) respectively controlling switches (such as 631, 635) in circuit portions 610-1M through 610-4M to REFP. Bus 953 contains switch control signals SUB0, SUB1, SUB2 and SUB3 (all active high) respectively controlling switches (such as 632, 636) in circuit portions 610-1M through 610-4M to REFM. It should be appreciated that for a 3-bit sub-code, each of paths 951-954 contains four control bits each, and the resulting 16 bits are used to control the corresponding 16 switches of FIG. 6, according to the approach described above.

The logic equations for generating the switch control signals are provided below (wherein NAND and NOR respectively indicate a NAND and NOR logic operation):

SUBZ0=(COUTP4 NAND HOLD)
SUBZ1=(COUTP2 NAND HOLD)
SUBZ2=(COUTP6 NAND HOLD)
SUBZ3=(COUTP0 NAND HOLD)
ADD0=(COUTP4 NOR HOLDZ)
ADD1=(COUTP2 NOR HOLDZ)
ADD2=(COUTP6 NOR HOLDZ)
ADD3=(COUTP0 NOR HOLDZ)
ADDZ0=(COUTM3 NAND HOLD)
ADDZ1=(COUTM5 NAND HOLD)
ADDZ2=(COUTM1 NAND HOLD)
ADDZ3=(COUTM7 NAND HOLD)
SUB0=(COUTM3 NOR HOLDZ)
SUB1=(COUTM5 NOR HOLDZ)
SUB2=(COUTM1 NOR HOLDZ)
SUB3=(COUTM7 NOR HOLDZ)

Switches 624, 628, 634, 638 as well as other switches connecting capacitors to input signal 111 may be controlled by control signals generated within the stage or from outside (of the stage).

The circuit structures thus provided operate to provide an amplified residue signal, as described below with examples.

7. Example Operation

The operation of the circuits described above is illustrated for three cases, when the input signal has strengths denoted by markers 710, 720 and 730 (FIG. 7) respectively.

When input signal 111 has a value denoted by marker 710, the outputs of comparators 810A-810H are as follows:

Comparator 810A: COUTP7 is at logic 0, and COUTM7 is at logic 1.
Comparator 810B: COUTP6 is at logic 0, and COUTM6 is at logic 1.
Comparator 810C: COUTP5 is at logic 1, and COUTM5 is at logic 0.
Comparator 810D: COUTP4 is at logic 1, and COUTM4 is at logic 0.
Comparator 810E: COUTP3 is at logic 1, and COUTM3 is at logic 0.
Comparator 810F: COUTP2 is at logic 1, and COUTM2 is at logic 0.
Comparator 810G: COUTP1 is at logic 1, and COUTM1 is at logic 0.
Comparator 810H: COUTP0 is at logic 1, and COUTM0 is at logic 0.

It may be verified from the logic equations provided above that, SUBZ0 and SUBZ1 will both be at logic 0, while SUB0 and SUB1 will both be at logic 1. As a result, capacitors 640-1P and 640-2P are both connected to REFP (during the hold phase), while corresponding capacitors 640-1M and 640-2M are both connected to REFM, since input signal 111 is greater (more positive than) both the corresponding positive thresholds C1+ and C2+.

ADD2 will be at logic 1 (SUBZ2 being at logic 1), and SUB2 will be at logic 1 (ADDZ2 being at logic 1). As a result, both of capacitors 640-3P and 640-3M are connected to REFM, as required since input signal strength lies between the corresponding thresholds C3+ and C3−.

SUBZ3 will be at logic 0 (ADD3 being at logic 0), and ADDZ3 will be at logic 0 (SUB3 being at logic 0). As a result, both of capacitors 640-4P and 640-4M are connected to REFP, as required since input signal strength lies between the corresponding thresholds C4+ and C4−.

b) When input signal 111 has a value denoted by marker 720, the outputs of comparators 810A-810H are as follows:

Comparator 810A: COUTP7 is at logic 0, and COUTM7 is at logic 1.
Comparator 810B: COUTP6 is at logic 0, and COUTM6 is at logic 1.
Comparator 810C: COUTP5 is at logic 0, and COUTM5 is at logic 1.
Comparator 810D: COUTP4 is at logic 1, and COUTM4 is at logic 0.
Comparator 810E: COUTP3 is at logic 1, and COUTM3 is at logic 0.
Comparator 810F: COUTP2 is at logic 1, and COUTM2 is at logic 0.
Comparator 810G: COUTP1 is at logic 1, and COUTM1 is at logic 0.
Comparator 810H: COUTP0 is at logic 1, and COUTM0 is at logic 0.

It may be verified from the logic equations provided above that, SUBZ0 will be at logic 0, while SUB0 will be at logic 1. As a result, capacitor 640-1P is connected to REFP (during the hold phase), while corresponding capacitor 640-1M is connected to REFM, since input signal 111 is greater (more positive than) the corresponding positive threshold C1+.

SUBZ1 will be at logic 0, and ADDZ1 will be at logic 0. As a result, capacitors 640-2P and 640-2M are both connected to REFP, as required since input signal strength lies between the corresponding thresholds C2+ and C2−.

ADD2 will be at logic 1 (SUBZ2 being at logic 1), and SUB2 will be at logic 1 (ADDZ2 being at logic 1). As a result, both of capacitors 640-3P and 640-3M are connected to REFM, as required since input signal strength lies between the corresponding thresholds C3+ and C3−.

SUBZ3 will be at logic 0 (ADD3 being at logic 0), and ADDZ3 will be at logic 0 (SUB3 being at logic 0). As a result, both of capacitors 640-4P and 640-4M are connected to REFP, as required since input signal strength lies between the corresponding thresholds C4+ and C4−.

c) When input signal 111 has a value denoted by marker 730, the outputs of comparators 810A-810H are as follows:

Comparator 810A: COUTP7 is at logic 0, and COUTM7 is at logic 1.
Comparator 810B: COUTP6 is at logic 0, and COUTM6 is at logic 1.
Comparator 810C: COUTP5 is at logic 0, and COUTM5 is at logic 1.
Comparator 810D: COUTP4 is at logic 0, and COUTM4 is at logic 1.
Comparator 810E: COUTP3 is at logic 0, and COUTM3 is at logic 1.
Comparator 810F: COUTP2 is at logic 1, and COUTM2 is at logic 0.
Comparator 810G: COUTP1 is at logic 1, and COUTM1 is at logic 0.
Comparator 810H: COUTP0 is at logic 1, and COUTM0 is at logic 0.

It may be verified from the logic equations provided above that, ADD0 will be at logic 1, while ADDZ0 will be at logic 0. As a result, capacitor 640-1P is connected to REFM (during the hold phase), while corresponding capacitor 640-1M is connected to REFP, as required since input signal 111 is lesser than (more negative than) the corresponding negative threshold C1−.

SUBZ1 will be at logic 0, and ADDZ1 will be at logic 0. As a result, capacitors 640-2P and 640-2M are both connected to REFP, as required since input signal strength lies between the corresponding thresholds C2+ and C2−.

ADD2 will be at logic 1 (SUBZ2 being at logic 1), and SUB2 will be at logic 1 (ADDZ2 being at logic 1). As a result, both of capacitors 640-3P and 640-3M are connected to REFM, as required since input signal strength lies between the corresponding thresholds C3+ and C3−.

SUBZ3 will be at logic 0 (ADD3 being at logic 0), and ADDZ3 will be at logic 0 (SUB3 being at logic 0). As a result, both of capacitors 640-4P and 640-4M are connected to REFP, as required since input signal strength lies between the corresponding thresholds C4+ and C4−.

Thus, when an amplified residue signal is received from stage 120-1, comparators 810A-810H in flash ADC 250 may generate the corresponding control bits, as shown in FIG. 8. The control bits are decoded according to the example logic of FIG. 9. The specific value on each output bit of FIG. 9 (contained in buses 951-954) determines the specific ones of switches circuit portions 610-1P through 610-4P and circuit portions 610-1M through 610-4M is connected to REFP or REFM, as described above (during a hold phase). As a result, OPAMP 650 generates an amplified residue as output on path 112P/112M.

From the above, it may be appreciated that the embodiments described with respect to FIGS. 6-9 require only $2^P$ capacitors, while the prior embodiment of FIG. 5 requires twice as many capacitors. In particular, it may be noted that for every capacitor in FIG. 6, the technique of FIG. 5 requires two capacitors. Similarly, FIG. 6 has only half as many switches as in FIG. 5.

In terms of operation, the switches of FIGS. 5 and 6 are operated differently when the input signal has a voltage between the positive and negative thresholds of the same magnitude (e.g., 730, which is between C1+ and C1−). In case of FIG. 5, one of capacitors 531 and 534 is connected to REFP, while the other is connected to REFM. Similarly, one of capacitors 537 and 540 is connected to REFP, while the other is connected to REFM. On the other hand, in FIG. 6, both of capacitors 640-1P and 640-1M are connected to either REFP or REFM.

On the other hand, in terms of comparison with the embodiment of FIG. 3A, though there are the same number of capacitors as in FIG. 6, the embodiment of FIG. 6 does not require connection of the capacitors to common mode reference voltage (REFCM).

Further, from the decoding logic of FIG. 9, it may be observed that only one level of logic is needed. Residue block 600, therefore, requires less complex decoding logic for controlling constituent switches, in addition to requiring a smaller area for implementation.

Residue block 600 (along with switch decoder 910) implemented in a stage (such as stage 120-1, FIG. 2) of a pipeline ADC may be incorporated as part of a device/system, as described next.

8. Device/System

Figure 10:
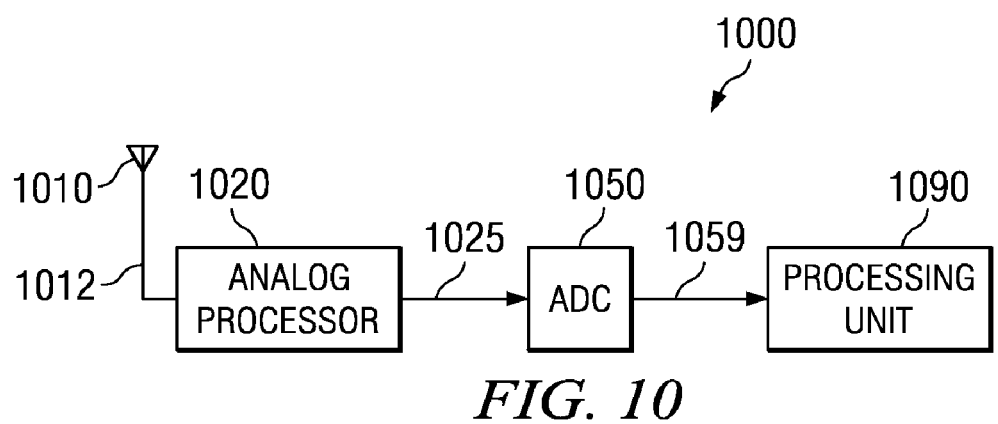
FIG. 10 is a block diagram of an example device/system in which several aspects of the present invention can be incorporated.

FIG. 10 is a block diagram of receiver system 1000 illustrating an example system in which the present invention may be implemented. Receiver system 1000, which may correspond to, for example, a mobile phone is shown containing antenna 1010, analog processor 1020, ADC 1050, and processing unit 1090. Each component is described in further detail below.

Antenna 1010 may receive various signals transmitted over a wireless medium. The received signals may be provided to analog processor 1020 on path 1012 for further processing. Analog processor 1020 may perform tasks such as amplification (or attenuation as desired), filtering, frequency conversion, etc., on received signals and provides the resulting signal on path 1025.

ADC 1050 converts the analog signal received on path 1025 to corresponding digital codes, and provides the digital codes to processing unit 1090 on path 1059 for further processing. ADC 1050 contains one or more stages containing a residue block and switch decoder similar to residue block 600 and switch decoder 910 described above.

Processing unit 1090 receives the recovered data to provide various user applications (such as telephone calls, data applications).

9. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A stage of a pipeline analog to digital converter (ADC) processing an input signal in differential form, wherein the input signal is received across a pair of differential input terminals, the stage comprising:

a sub-ADC portion to generate a sub-code of P bits representing a strength of the input signal, wherein P is an integer;

a residue block to generate a residue signal by subtracting the input signal from a signal level representing the digital value, the residue block including:

a differential amplifier having first input terminal and a second input terminal, the differential amplifier providing the residue signal on a first output terminal and a second output terminal;

a first feedback capacitor coupled between the first output terminal and the first input terminal of the differential amplifier;

a first bank of $(2^{(P-1)})$ capacitors, a first terminal of each capacitor in the first bank of capacitors being coupled to the first input terminal of the differential amplifier;

a second bank of $(2^{(P-1)})$ capacitors, a first terminal of each capacitor in the second bank of capacitors being coupled to the second input terminal of the differential amplifier;

a plurality of sampling switches, wherein each sampling switch, in a first phase connects the input signal to at least one of the capacitors from one of the first bank of capacitors and the second bank of capacitors;

a plurality of positive reference switches, wherein each positive reference switch is adapted to connect at least one of the capacitors from one of the first bank and the second bank to a positive reference voltage during a second phase; and a plurality of negative reference switches, wherein each negative reference switch is adapted to connect at least one of the capacitors from one of the first and second back to a negative reference voltage during a second phase, wherein a common mode reference voltage is the average of the positive and negative reference voltages, and wherein the common mode reference voltage is generally maintained through actuation of the positive and negative reference switches; and a switch decoder that is coupled to the sub-ADC portion, wherein the switch decoder includes:

a NAND gate that receives a hold signal, that receives a control signal from the sub-ADC portion that is associated with a subset of capacitors from the first and second sets of capacitors, and that outputs a signal that actuates and deactuates the negative reference switches associated with the subset, wherein the hold signal indicates the first and second phases; and a NOR gate that receives an inverse of the hold signal, that is that receives the control signal, and that outputs a signal that actuates the positive reference switches associated with the subset.

2. The stage of claim 1, wherein the differential amplifier provides the residue signal in differential form across a pair of output terminals including the first output terminal and the second output terminal, the residue block further comprising:

a second feedback capacitor coupled between the second output terminal and the second input terminal.

3. The stage of claim 1, wherein the switch decoder further comprises:

a second NAND gate that receives the hold signal, that receives a second control signal from the sub-ADC portion that is associated with a second subset of capacitors from the first and second sets of capacitors, and that outputs a signal that actuates and deactuates the negative reference switches associated with the second subset; and a second NOR gate that receives an inverse of the hold signal, that is that receives the second control signal, and that outputs a signal that actuates the positive reference switches associated with the second subset.

* * * * *